United States Patent
Tang

(10) Patent No.: US 10,355,065 B2
(45) Date of Patent: Jul. 16, 2019

(54) DOUBLE-SIDED DISPLAY AND METHOD OF PACKAGING THE SAME

(71) Applicant: WUHAN CHINA STAR OPTOELECTRONICS TECHNOLOGY CO., LTD., Wuhan, Hubei (CN)

(72) Inventor: Yuejun Tang, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 15/322,747

(22) PCT Filed: Dec. 23, 2016

(86) PCT No.: PCT/CN2016/111614
§ 371 (c)(1),
(2) Date: Dec. 29, 2016

(87) PCT Pub. No.: WO2018/094798
PCT Pub. Date: May 31, 2018

(65) Prior Publication Data
US 2018/0151657 A1    May 31, 2018

(30) Foreign Application Priority Data

Nov. 28, 2016 (CN) .......................... 2016 1 1064040

(51) Int. Cl.
*H01L 29/08* (2006.01)
*H01L 27/32* (2006.01)
(Continued)

(52) U.S. Cl.
CPC ...... *H01L 27/3267* (2013.01); *H01L 51/5246* (2013.01); *H01L 51/56* (2013.01); *H01L 2227/323* (2013.01); *H01L 2251/5323* (2013.01)

(58) Field of Classification Search
CPC ............. H01L 51/524–51/525; H01L 27/3267
See application file for complete search history.

(56) References Cited

U.S. PATENT DOCUMENTS

2006/0066236 A1  3/2006 Tanaka et al.
2007/0080629 A1* 4/2007 Ko .................. H01L 25/048
                                                    313/504
(Continued)

FOREIGN PATENT DOCUMENTS

CN          1753053 A       3/2006
CN          1815748 A       8/2006
(Continued)

*Primary Examiner* — Caleb E Henry
(74) *Attorney, Agent, or Firm* — Mark M. Freidman

(57) ABSTRACT

A double-sided OLED packaging structure is provided and has an upper plate and a lower plate. Edges of each of the upper plate and the lower plate has a bending structure disposed thereon. A packaging glue is disposed on an inner side of the bending structure, such that two light emitting display portions are corresponding to and connected to each other by the packaging glues and the bending structures. Therefore, the double-sided OLED packaging structure can protect an organic light-emitting layer from high-temperature damage and prolong the display life by disposing the packaging glue on a side part of the packaging cover and thus away from a light-emitting surface.

5 Claims, 4 Drawing Sheets

(51) Int. Cl.
*H01L 51/52* (2006.01)
*H01L 51/56* (2006.01)

(56) References Cited

U.S. PATENT DOCUMENTS

| | | |
|---|---|---|
| 2011/0019351 A1 | 1/2011 | Bayne et al. |
| 2014/0246665 A1* | 9/2014 | Lang .................... H01L 51/524 |
| | | 257/40 |
| 2018/0033997 A1 | 2/2018 | Tang |
| 2018/0151657 A1* | 5/2018 | Tang ................... H01L 27/3267 |

FOREIGN PATENT DOCUMENTS

| | | |
|---|---|---|
| CN | 102046900 A | 5/2011 |
| CN | 105932174 A | 9/2016 |
| KR | 100624131 B1 | 9/2006 |

\* cited by examiner

DOUBLE-SIDED DISPLAY AND METHOD OF PACKAGING THE SAME

FIELD OF THE INVENTION

The present invention relates to a technical field of displays, and more particularly to a double-sided display and a method of packaging the same.

BACKGROUND OF THE INVENTION

Organic light emitting diodes (OLED) are becoming more and more popular, and products such as mobile phones, media players, small entry-level televisions, and so on are the most significant. The OLED display is a self-luminous device with the advantages of bright colors, a high luminous efficiency, a light weight, a wide viewing angle, a fast response, a flexible preparation, etc. Simultaneously, electrons are injected into a cathode electrode when the OLED device works, which requires a work function of the cathode electrode to be as low as possible. However, these metals used for the cathode, such as aluminum, magnesium, calcium, etc., are generally more active and easy to react with water vapor infiltrated therein, thereby affecting a working life of the OLED devices. Therefore, the OLED devices need to be packaged upon production so as to avoid water vapor entering.

With diversifications of electronic products, double-sided displays has a special displaying feature. However, in an OLED substrate packing of the conventional technology, an organic light emitting diode surface on an OLED substrate is coated with a glue to be adhered to and fix with a packaging cover, and a sealing portion is relatively close to a light emitting layer. The light emitting layer is damaged when a high temperature is used on the sealing portion, thereby affecting the displaying life of the organic light emitting diode.

Therefore, the conventional technology has the following technical problems that: the conventional double-sided OLED display devices are conventionally packaged, which is disadvantageous to a long-term use of the display panel and needs to be improved.

SUMMARY OF THE INVENTION

The present invention provides a double-sided OLED display, in which a light emitting display portion is disposed in a transparent packaging shell, and a side part of the light emitting display portion is adhered to the transparent packaging shell. The technical problems of a display surface being damaged due to coating the sealing glue on the light emitting display portion can be solved.

In order to solve the above technical problems, the present invention provides a double-sided OLED display which comprises:
a first light emitting display portion;
a second light emitting display portion located below the first light emitting display portion;
an upper packaging cover configured to package the first light emitting display portion, and comprising:
an upper plate located above the first light emitting display portion; and
a first bending structure formed on three edges of the upper plate and extended downwardly; and
a lower packaging cover configured to package the second light emitting display portion, and comprising:
a lower plate located below the second light emitting display portion; and
a second bending structure formed on three edges of the lower plate and extended upwardly;
wherein the upper packaging cover and the lower packaging cover are combined with each other to form a packaging chamber, and the first light emitting display portion and the second light emitting display portion are packaged inside the packaging chamber;
wherein a thickness of the first bending structure is less than that of the upper plate, and a thickness of the second bending structure is less than that of the lower plate.

According to a preferred embodiment of the present invention, the upper packaging cover faces the lower packaging cover, and is connected to the lower packaging cover; and a bottom end of the first bending structure and a top end of the second bending structure are attached to each other.

According to a preferred embodiment of the present invention, the first bending structure is extended downwardly to a bottom side of the first light emitting display portion, and a side part of the first light emitting portion is adhered to an inner side of the first bending structure by a first glue layer; and
the second bending structure is extended upwardly to a top side of the second light emitting display portion, and a side part of the second light emitting portion is adhered to an inner side of the second bending structure by a second glue layer.

According to a preferred embodiment of the present invention, the upper packaging cover and the lower packaging cover are engaged with each other, the upper packaging cover is located on an inner side of the lower packaging cover, and an outer side of the first bending structure and an inner side of the second bending structure are adhered to each other.

According to a preferred embodiment of the present invention, the first bending structure is extended downwardly to a bottom side of the second light emitting display portion, and a side part of the first light emitting portion and a side part of the second light emitting portion are adhered to an inner side of the first bending structure by a first glue layer; and
the second bending structure is extended upwardly to a top side of the first bending structure, and an outer side of the first bending structure is adhered to an inner side of the second bending structure by a second glue layer.

According to a preferred embodiment of the present invention, the upper packaging cover and the lower packaging cover are formed in a manner of perfusion molding by a liquid glass or a plastic.

According to a preferred embodiment of the present invention, each of the upper packaging cover and the lower packaging cover has an insulating layer disposed therein, and the insulating layers are formed respectively on a surface of the first light emitting display portion and a surface of the second light emitting display portion.

According to a preferred embodiment of the present invention, each of the insulating layers is an inorganic material layer of silicon nitride, silicon oxide, or aluminum oxide, or a combination layer of any combination thereof.

The present invention further provides a double-sided OLED display, comprising:
a first light emitting display portion;
a second light emitting display portion located below the first light emitting display portion;

an upper packaging cover configured to package the first light emitting display portion, and comprising:
an upper plate located above the first light emitting display portion; and
a first bending structure formed on three edges of the upper plate and extended downwardly; and
a lower packaging cover configured to package the second light emitting display portion, and comprising:
a lower plate located below the second light emitting display portion; and
a second bending structure formed on three edges of the lower plate and extended upwardly;
wherein the upper packaging cover and the lower packaging cover are combined with each other to form a packaging chamber, and the first light emitting display portion and the second light emitting display portion are packaged inside the packaging chamber.

According to a preferred embodiment of the present invention, the upper packaging cover faces the lower packaging cover and is connected to the lower packaging cover; and a bottom end of the first bending structure and a top end of the second bending structure are attached to each other.

According to a preferred embodiment of the present invention, the first bending structure is extended downwardly to a bottom side of the first light emitting display portion, and a side part of the first light emitting portion is adhered to an inner side of the first bending structure by a first glue layer; and
the second bending structure is extended upwardly to a top side of the second light emitting display portion, and a side part of the second light emitting portion is adhered to an inner side of the second bending structure by a second glue layer.

According to a preferred embodiment of the present invention, the upper packaging cover and the lower packaging cover are engaged with each other, the upper packaging cover is located on an inner side of the lower packaging cover, and an outer side of the first bending structure and an inner side of the second bending structure are adhered to each other.

According to a preferred embodiment of the present invention, the first bending structure is extended downwardly to a bottom side of the second light emitting display portion, and a side part of the first light emitting portion and a side part of the second light emitting portion are adhered to an inner side of the first bending structure by a first glue layer; and
the lower plate has a width greater than the upper plate, the second bending structure is extended upwardly to a top side of the first bending structure, and an outer side of the first bending structure is adhered to an inner side of the second bending structure by a second glue layer.

According to a preferred embodiment of the present invention, the upper packaging cover and the lower packaging cover are formed in a manner of perfusion molding by a liquid glass or a plastic.

According to a preferred embodiment of the present invention, each of the upper packaging cover and the lower packaging cover has an insulating layer disposed therein, and the insulating layers are formed respectively on a surface of the first light emitting display portion and a surface of the second light emitting display portion.

According to a preferred embodiment of the present invention, each of the insulating layers is an inorganic material layer of silicon nitride, silicon oxide, or aluminum oxide, or a combination layer of any combination thereof.

The present invention further provides a method of packaging a double-sided OLED display, comprising following steps of:
(S101) providing a lower packaging cover;
(S102) providing a light emitting display portion, wherein the light emitting display portion comprises a first light emitting display portion, and a second light emitting display portion disposed below and adhered to the first light emitting display portion, and wherein a first glue layer is disposed on a side part of the first light emitting display portion, and a second glue layer is disposed on a side part of the second light emitting display portion;
(S103) placing the light emitting display portion on an inner side of the lower packaging cover, and adhering a side part of the second light emitting display portion to an inner side of the lower packaging cover by the second glue layer;
(S104) providing an upper packaging cover; and
(S105) covering the upper packaging cover with a top part of the lower packaging cover, and adhering a side part of the first light emitting display portion to an inner side of the upper packaging cover by the first glue layer.

Therefore, the double-sided OLED display of the present invention can protect the display from high-temperature damage and prolong the display life by disposing a glue on a side part of a packaging cover and thus away from a light-emitting surface. A thinning treatment is performed on the side part of the packaging cover and is beneficial to reduce an edge width of the double-sided display.

DESCRIPTION OF THE DRAWINGS

In order to more clearly describe embodiments of the present invention or technical solutions in a conventional technology, drawings required to be used for the embodiments or descriptions of the conventional technology are simply described hereinafter. Apparently, the drawings described below only illustrate some embodiments of the present invention. Those skilled in the art can obtain other drawings based on these drawings disclosed herein without creative effort.

DETAILED DESCRIPTION OF THE PREFERRED EMBODIMENTS

Figure 1:
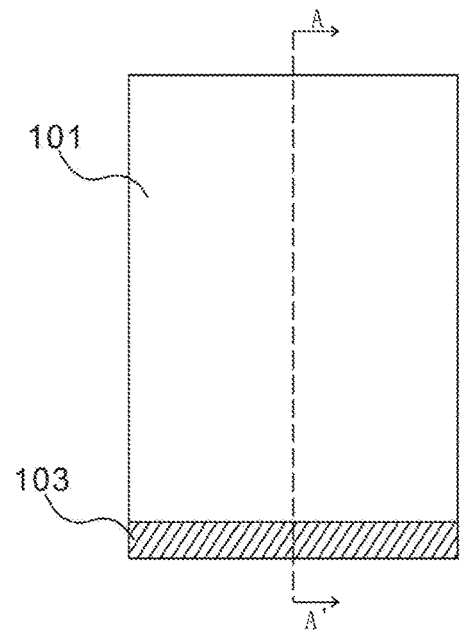
FIG. 1 is a top view of embodiment 1 of a double-sided OLED display of the present invention.

The following description of the embodiments with reference to the appended drawings is used for illustrating specific embodiments which may be used for carrying out the present invention. The directional terms described by the present invention, such as "upper", "lower", "front", "back", "left", "right", "inner", "outer", "side", etc. are only directions by referring to the accompanying drawings. Thus, the used directional terms are used to describe and understand the present invention, but the present invention is not limited thereto. In figures, elements with similar structures are indicated with the same numbers.

The present invention provides a novel packaging structure of an OLED display device, which can effectively overcome a drawback, in view of the technical problem of a display surface being damaged by the conventional packaging method of the OLED display device.

A first light emitting display portion and a second light emitting display portion described by the present invention are combined with each other to form a double-sided display portion. The first light emitting display portion comprises a first light emitting layer and a first substrate. The first light emitting layer is disposed on an upper surface of the first substrate. The second light emitting display portion comprises a second light emitting layer and a second substrate. The second light emitting layer is disposed on a lower surface of the second substrate. The first substrate and the second substrate are adhere to each other.

The light emitting layer comprises an OLED display device array. The OLED display device comprises an electrical TFT switching layer used for controlling, an anode electrode and a cathode electrode. A light emitting material is disposed between the anode electrode and the cathode electrode to form a light emitting material layer, wherein a hole injection layer, a hole transport layer, an electron transport layer, an electron injection layer, etc. can be further included in between the anode electrode and the cathode electrode besides the light emitting material layer. When a driving voltage is applied to the anode electrode and the cathode electrode, holes passing through the hole transport layer and electrons passing through the electron transport layer move toward the light emitting material layer to form excitons, and the light emitting layer emits a visible light. In the OLED display apparatus, pixels with OLED (having the above structure) are disposed in an array and are controlled by a data voltage and a scan voltage, thereby displaying an image.

A packaging structure of the present invention is used for packaging the above double-sided display portion. The packaging structure comprises: an upper packaging cover configured to package the first light emitting display portion, and comprising: an upper plate located above the first light emitting display portion; and a first bending structure formed on three edges of the upper plate and extended downwardly; a lower packaging cover configured to package the second light emitting display portion, and comprising: a lower plate located below the second light emitting display portion; and a second bending structure formed on three edges of the lower plate and extended upwardly; the upper packaging cover and the lower packaging cover are combined with each other to form a packaging chamber, and the first light emitting display portion and the second light emitting display portion are packaged inside the packaging chamber.

The upper packaging cover and the lower packaging cover are respectively made from a transparent material, such as formed in a manner of perfusion molding by a liquid glass or a plastic.

Preferably, each of the upper packaging cover and the lower packaging cover has an insulating layer 110, 210, and 310 disposed therein, and the insulating layers 110, 210, and 310 are formed respectively on a surface of the first light emitting display portion and a surface of the second light emitting display portion, so as to avoid a short circuit phenomenon due to the OLED display device contacting with water vapor/oxide. Further, each of the insulating layers 110, 210, and 310 is an inorganic material layer of silicon nitride, silicon oxide, or aluminum oxide, or a combination layer of any combination thereof. A suitable organic layer may be included.

The above-mentioned packaging structure will be described in detail by the following embodiments.

Embodiment 1

Refer to FIG. 1, which is a top view of a double-sided OLED display of the present invention.

As shown in FIG. 1, an upper packaging cover 101 is included. A first light emitting display portion is fixed in the upper packaging cover 101. The first light emitting display portion includes a first light emitting layer and a first substrate 103 located on a bottom part of the first light emitting layer. An end portion of the first substrate 103 is extended from an end of the upper packaging cover 101 to bind a display control device.

Figure 2:
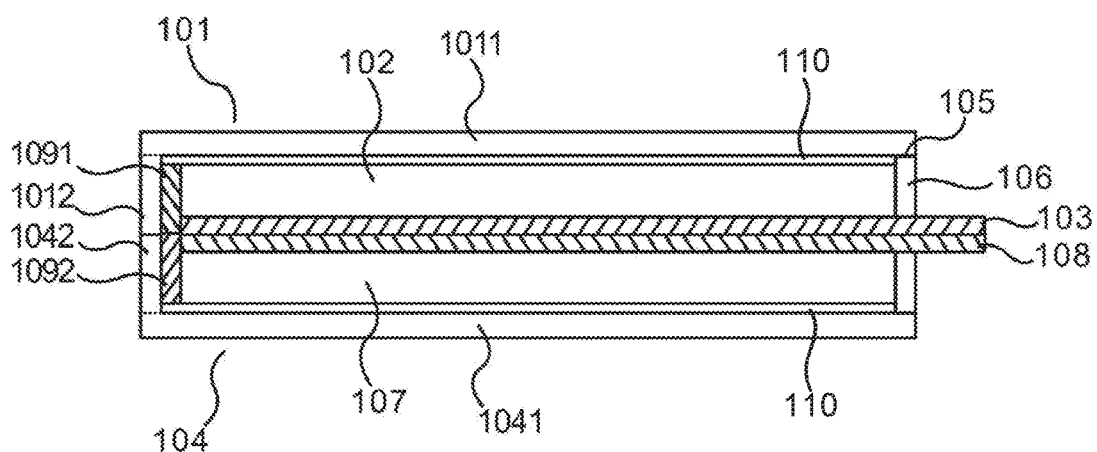
FIG. 2 is a cross-sectional diagram of a double-sided OLED display along line A-A' in FIG. 1.

As shown in FIG. 2, which is a cross-sectional diagram along line A-A' in FIG. 1, an upper packaging cover 101 and a lower packaging cover 104 are included. A lower surface of the upper packaging cover 101 is closely attached to an upper surface of the lower packaging cover 104. The upper packaging cover 101 is combined with the lower packaging cover to form a receiving chamber which is used to receive the first light emitting display portion and the second light emitting display portion. An opening 105 is disposed on the same side of the upper packaging cover 101 and the lower packaging cover 104. A packaging can be performed on the opening 105 by a second sealing glue 106.

The first light emitting display portion comprises a first light emitting layer 102 and a first substrate 103. The second light emitting display portion comprises a second light emitting layer 107 and a second substrate 108. The first substrate 103 is adhered to the second substrate 108. An end of the first substrate 103 and an end of the second substrate 108 are extended from the opening 105. Preferably, the first substrate 103 and the second substrate 108 are fixed together by an adhesive agent/an adhesive layer. For example, a transparent or opaque adhesive material such as OCA/OCR adhesive material.

The first light emitting display portion and the second light emitting display portion are adhered to the packaging cover by a first sealing glue, wherein the first sealing glue comprises a first glue layer 1091 and a second glue layer 1092.

The upper packaging cover 101 comprises an upper plate 1011. Three edges of the upper plate 1011 are extended downwardly to form a first bending structure 1012, so as to form an opening 105 in a side of the upper packaging cover 101, which is suitable for the first substrate 103 extended out of the upper packaging cover 101. A first glue layer 1091 is disposed on a side part of the first light emitting display portion. The first light emitting display portion is adhered to an inner side of the first bending structure 1012 by the first glue layer 1091.

The lower packaging cover 104 comprises a lower plate 1041. Three edges of the lower plate 1041 are extended upwardly to form a second bending structure 1042, so as to form an opening 105 in a side of the lower packaging cover 104, which is suitable for the second substrate 108 extended out of the lower packaging cover 104. A second glue layer 1092 is disposed on a side part of the second light emitting display portion. The second light emitting display portion is adhered to an inner side of the second bending structure 1042 by the second glue layer 1092.

When a packaging is performed, the lower packaging cover 104 is horizontally placed on a packaging platform. Then, a double-sided display portion consisting of the first light emitting display portion and the second light emit is disposed in the lower packaging cover 104, such that the side part of the second light emitting display portion is adhered to an inner side of the second bending structure 1042. Then, the upper packaging cover 101 covers over the first light emitting display portion. Further, an end with an opening 105 of the upper packaging cover 101 and an end with an opening 105 of the lower packaging cover 104 face an identical direction. Immediately thereafter, a bottom part of the first bending structure 1012 is adhered to a top part of the second bending structure 1042. Simultaneously, a side part of the first light emitting display portion is adhered to an inner side of the first bending structure 1012. Finally, a sealing process is performed on the openings 105 of the upper packaging cover 101 and the lower packaging cover 104 by using the second sealing glue 106.

In comparison with the conventional technology, the double-sided OLED display packaging structure of the present embodiment is relatively convenient upon packaging. Compared with a glue layer disposed on a display surface of the double-sided display portion, the problem of damaging the OLED light emitting layer induced by a temperature which is too high during a packaging process can be avoided by an adhering place of the double-sided and a packaging shell being located on the side part of the double-sided display portion.

Embodiment 2

Figure 3:
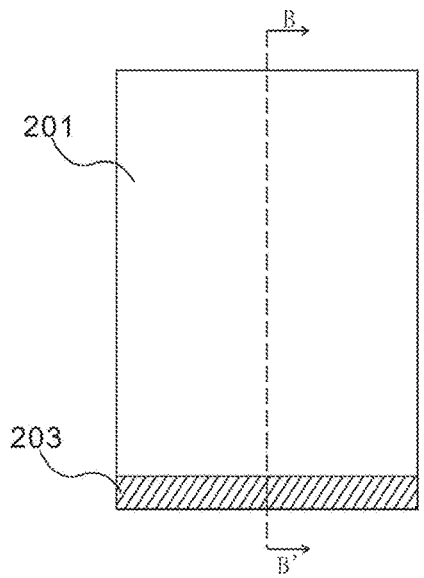
FIG. 3 is a top view of embodiment 1 of a double-sided OLED display of the present invention.

Refer to FIG. 3, which is a top view of a double-sided OLED display of the present invention.

As shown in FIG. 3, an upper packaging cover 201 is included. A first light emitting display portion is fixed in the upper packaging cover 201. The first light emitting display portion includes a first light emitting layer and a first substrate 203 located on a bottom part of the first light emitting layer. An end portion of the first substrate 203 is extended from an end of the upper packaging cover 201 to bind a display control device.

Figure 4:
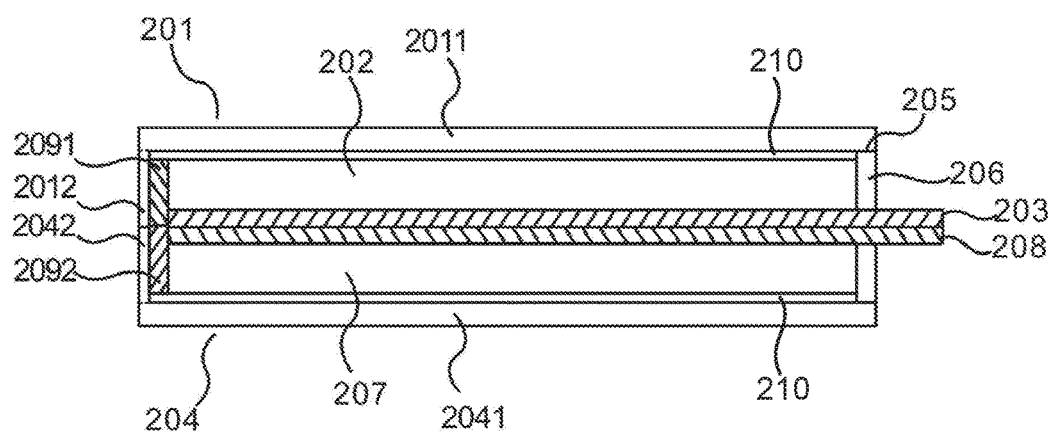
FIG. 4 is a cross-sectional diagram of a double-sided OLED display along line B-B' in FIG. 3.

As shown in FIG. 4, which is a cross-sectional diagram along line B-B' in FIG. 3. An upper packaging cover 201 and a lower packaging cover 204 are included. A lower surface of the upper packaging cover 201 is closely attached to an upper surface of the lower packaging cover 204. The upper packaging cover 201 is combined with the lower packaging cover 204 to form a receiving chamber which is used to receive the first light emitting display portion and the second light emitting display portion. An opening 205 is disposed on the same side of the upper packaging cover 201 and the lower packaging cover 204. A packaging can be performed on the opening 205 by a second sealing glue 206.

A side part of the light emitting display portion is adhered to an inner side of the packaging cover by a first sealing glue. The first sealing glue comprises a first glue layer 2091 and a second glue layer 2092.

The first light emitting display portion comprises a first light emitting layer 202 and a first substrate 203. The second light emitting display portion comprises a second light emitting layer 207 and a second substrate 208. The first substrate 203 is adhered to the second substrate 208. An end of the first substrate 203 and an end of the second substrate 208 are extended from the opening 205.

The upper packaging cover 201 comprises: an upper plate 2011; and a first bending structure 2012 formed on three edges of the upper plate 2011. The lower packaging cover 204 comprises: a lower plate 2041; and a second bending structure 2042 formed on three edges of the lower plate 2041. A bottom part of the first bending structure 2012 is attached to a top part of the second bending structure 2042.

A first glue layer 2091 is disposed on a side part of the first light emitting display portion. The first light emitting display portion is adhered to an inner side of the first bending structure 2012 by the first glue layer 2091.

A second glue layer 2092 is disposed on a side part of the second light emitting display portion. The second light emitting display portion is adhered to an inner side of the second bending structure 2042 by the second glue layer 2092.

The present embodiment and the Embodiment 2 are different from a thinning treatment, which is performed on the first bending structure 2012 and the second bending structure 2042, so as to achieve a double-sided OLED display with a narrow frame.

Embodiment 3

Figure 5:
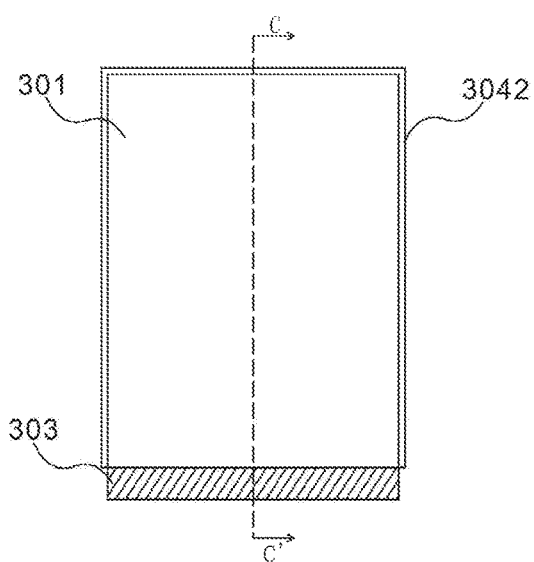
FIG. 5 is a top view of embodiment 1 of a double-sided OLED display of the present invention.

Refer to FIG. 5, which is a top view of a double-sided OLED display of the present invention.

As shown in FIG. 5, an upper packaging cover 301 is included. A first light emitting display portion is fixed in the upper packaging cover 301. The first light emitting display portion includes a first light emitting layer and a first substrate 303 located on a bottom part of the first light emitting layer. An end portion of the first substrate 303 is extended from an end of the upper packaging cover 301 to bind a display control device.

Figure 6:
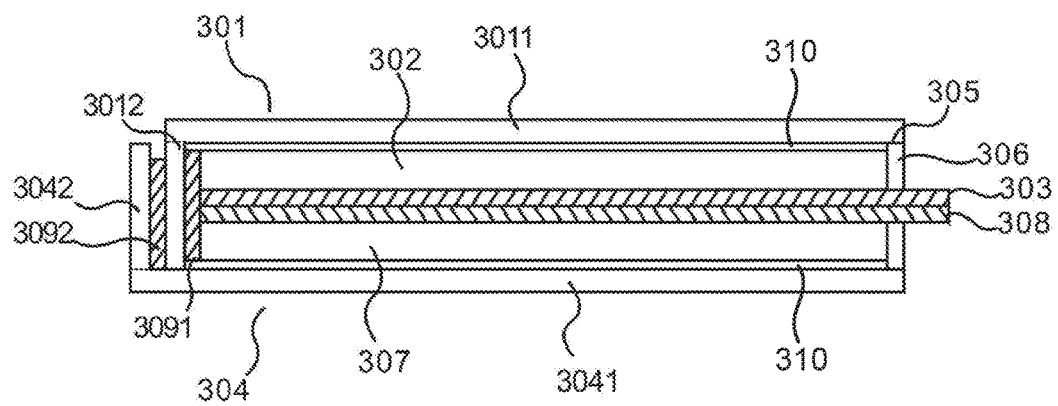
FIG. 6 is a cross-sectional diagram of a double-sided OLED display along line C-C' in FIG. 5.

As shown in FIG. 6, which is a cross-sectional diagram along line C-C' in FIG. 5, an upper packaging cover 301 and a lower packaging cover 304 are included. The upper packaging cover 301 and the lower packaging cover 304 are engaged with each other, i.e., the upper packaging cover 301 is partly or entirely located in an inner part of the lower packaging cover 304. The upper packaging cover 301 is combined with the lower packaging cover 304 to form a receiving chamber which is used to receive the first light emitting display portion and the second light emitting display portion. An opening 305 is disposed on the same side of the upper packaging cover 301 and the lower packaging cover 304. A packaging can be performed on the opening 305 by a second sealing glue 306.

The first light emitting display portion comprises a first light emitting layer 302 and a first substrate 303. The second light emitting display portion comprises a second light emitting layer 307 and a second substrate 308. The first substrate 303 is adhered to the second substrate 308. An end of the first substrate 303 and an end of the second substrate 308 are extended from the opening 305.

The upper packaging cover 301 comprises an upper plate 3011. Three edges of the upper plate 3011 are extended downwardly to form a first bending structure 3012, so as to form an opening 305 in a side of the upper packaging cover 301, which is suitable for the first substrate 303 extended out of the upper packaging cover 301.

The lower packaging cover 304 comprises a lower plate 3041. Three edges of the lower plate 3041 are extended upwardly to form a second bending structure 3042, so as to form an opening 305 in a side of the lower packaging cover 304, which is suitable for the second substrate 308 extended out of the lower packaging cover 304.

The first bending structure 3012 is extended downwardly to a bottom part of the double-sided display consisted of the first light emitting display portion and the second light emitting display portion. The lower plate 3041 is slightly wider than the upper plate 3011, such that an inner side of the second bending structure 3042 is closely attached to and extended upwardly along an outer side of the first bending structure 3012. The second bending structure 3042 is extended to an end portion of the upper plate 3011.

The packaging structure further comprises a first packaging glue. The first packaging glue comprises a first glue layer 3091 and a second glue layer 3092.

When a packaging is performed, a side of the first bending structure 3012 of the upper packaging cover 301 is upward and is horizontally placed on a packaging platform. Then, the double-sided display is placed in the upper packaging cover 301. Thereafter, the side part of the double-sided display portion is adhered to the inner side of the first bending structure 3012 by the first glue layer 3091. Then, the second packaging cover is overturned and engaged on the upper packaging cover 301, such that an outer side of the first bending structure 3012 is adhered to an inner side of the second bending structure 3042 by the second glue layer 3092. Finally, a sealing process is performed on the openings 305 of the upper packaging cover 301 and the lower packaging cover 304 by using the second sealing glue 306.

Preferably, a sealing process is performed on one or both of the first bending structure 3012 and the second bending structure 3042, which is beneficial to reduce a side frame width of the double-sided display.

In comparison with the conventional technology, the double-sided OLED display packaging structure of the present embodiment has a relatively large packaging area of a packaging layer so as to firmly fix the double-sided display portion in a packaging shell. Simultaneously, a double-layered packaging side wall is formed by an overlapping part of the upper packaging cover 301 and the lower packaging cover 304, so as to further protect the inner part of the packaging cover from the OLED display device being damaged by water vapor and oxygen intrusion.

Figure 7:
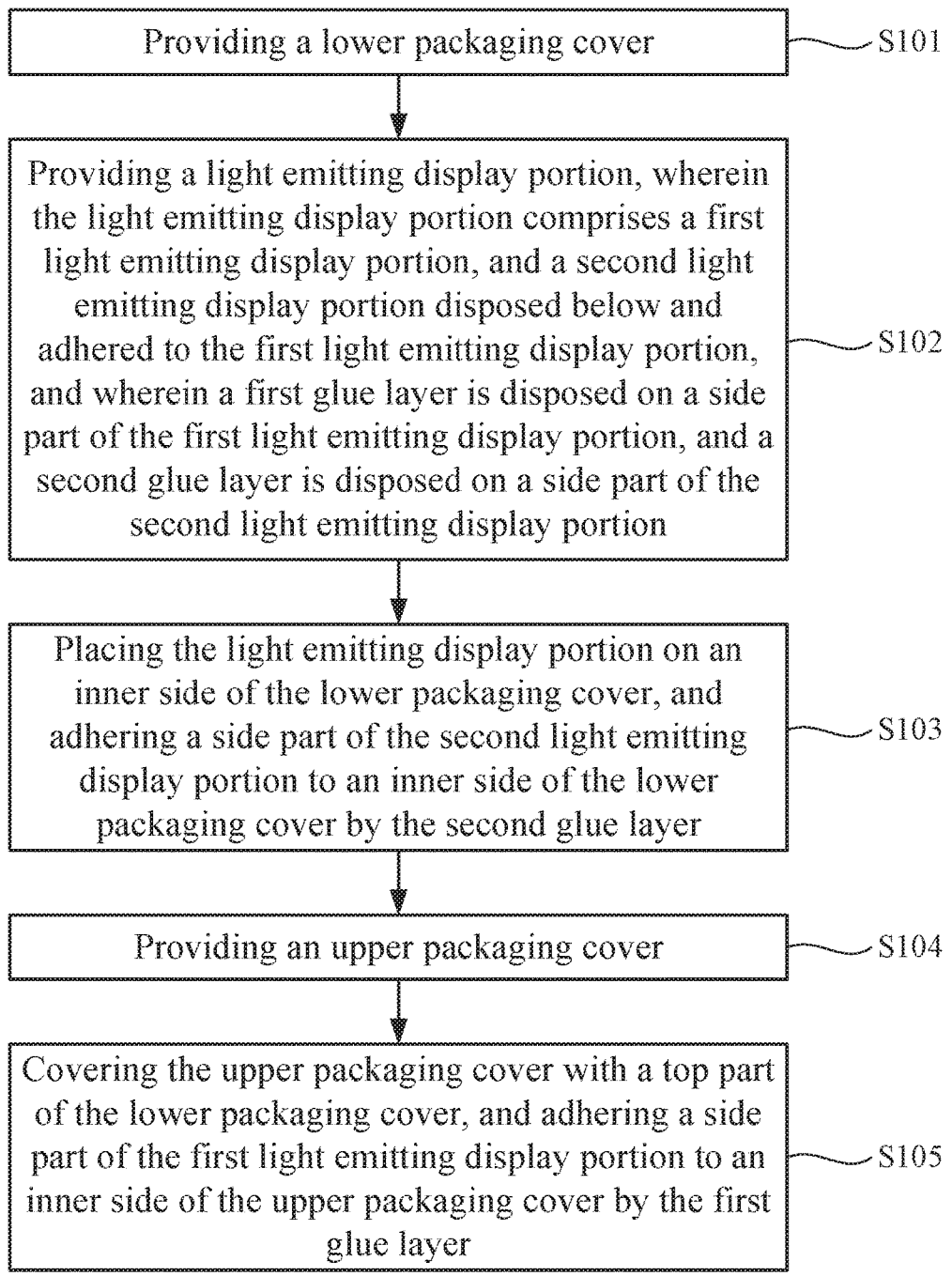
FIG. 7 is a flow chart of a method of packaging a double-sided OLED display of the present invention.

As shown in FIG. 7, the present invention further provides a method of packaging a double-sided OLED display, comprising the following steps:

(S101) providing a lower packaging cover;

(S102) providing a light emitting display portion, wherein the light emitting display portion comprises a first light emitting display portion, and a second light emitting display portion disposed below and adhered to the first light emitting display portion, and wherein a first glue layer is disposed on a side part of the first light emitting display portion, and a second glue layer is disposed on a side part of the second light emitting display portion;

(S103) placing the light emitting display portion on an inner side of the lower packaging cover, and adhering a side part of the second light emitting display portion to an inner side of the lower packaging cover by the second glue layer;

(S104) providing an upper packaging cover; and (S105) covering the upper packaging cover with a top part of the lower packaging cover, and adhering a side part of the first light emitting display portion to an inner side of the upper packaging cover by the first glue layer.

As described above, although the present invention has been described in preferred embodiments, they are not intended to limit the invention. One of ordinary skill in the art, without departing from the spirit and scope of the invention within, can make various modifications and variations, so the range of the scope of the invention is defined by the claims.

What is claimed is:

1. A double-sided OLED display, comprising:
   a first light emitting display portion, comprising:
      a first light emitting layer; and
      a first substrate located on a bottom part of the first light emitting layer;
   a second light emitting display portion located below the first light emitting display portion, comprising:
      a second light emitting layer; and
      a second substrate located on a top part of the second light emitting layer;
   an upper packaging cover configured to package the first light emitting display portion, and comprising:
      an upper plate located above the first light emitting display portion, the upper plate including a first extending portion extended downwardly from three edges of the upper plate; and
   a lower packaging cover configured to package the second light emitting display portion, and comprising:
      a lower plate located below the second light emitting display portion, the lower plate including a second extending portion extended upwardly from three edges of the lower plate;
   wherein the upper packaging cover and the lower packaging cover are combined with each other to form a packaging chamber, and the first light emitting display portion and the second light emitting display portion are packaged inside the packaging chamber; and
   wherein the upper packaging cover faces the lower packaging cover and is connected to the lower packaging cover; and wherein a bottom end of the first bending portion and a top end of the second bending portion are directly attached to each other.

2. The double-sided OLED display according to claim 1, wherein the first extending portion extends downwardly to a bottom side of the first light emitting display portion, and a side part of the first light emitting portion is adhered to an inner side of the first extending portion by a first glue layer; and
   the second extending portion extends upwardly to a top side of the second light emitting display portion, and side part of the second light emitting portion is adhered to an inner side of the second extending portion by a second glue layer.

3. The double-sided OLED display according to claim 1, wherein the upper packaging cover and the lower packaging cover are formed in a manner of perfusion molding by a liquid glass or a plastic.

4. The double-sided OLED display according to claim 1, wherein each of the upper packaging cover and the lower packaging cover has an insulating layer disposed therein, and the insulating layers are formed on a surface of the first light emitting display portion and a surface of the second light emitting display portion respectively.

5. The double-sided OLED display according to claim 4, wherein each of the insulating layers is an inorganic material layer of silicon nitride, silicon oxide, or aluminum oxide, or a combination layer of any combination thereof.

* * * * *